United States Patent [19]

[11] 4,207,793

Ippolito et al.

[45] Jun. 17, 1980

[54] VARIABLE RATE PORTAMENTO SYSTEM

[75] Inventors: Anthony C. Ippolito, North Tonawanda; William R. Hoskinson, Williamsville, both of N.Y.

[73] Assignee: The Wurlitzer Company, DeKalb, Ill.

[21] Appl. No.: 770,412

[22] Filed: Feb. 22, 1977

[51] Int. Cl.[2] .................... G01R 23/12; G01R 25/04; G10H 1/02

[52] U.S. Cl. .............................. 84/1.24; 84/DIG. 10; 324/82; 324/83 FE

[58] Field of Search ................ 84/1.24, 454, DIG. 10, 84/DIG. 18, 1.01; 324/78 R, 79 R, 82, 83 R, 83 FE

[56] References Cited

U.S. PATENT DOCUMENTS

| | | | |
|---|---|---|---|
| 3,347,973 | 10/1967 | Freeman | 84/1.24 |
| 3,472,116 | 10/1969 | Schott | 84/454 |
| 3,800,060 | 3/1974 | Hallman, Jr. | 84/1.24 |
| 3,956,961 | 5/1976 | Peterson | 84/1.24 |
| 4,058,042 | 11/1977 | Wade et al. | 84/1.01 |
| 4,063,484 | 12/1977 | Robinson | 84/1.24 |
| 4,073,209 | 2/1978 | Whittington et al. | 84/1.24 |
| 4,077,298 | 3/1978 | Kondo | 84/454 |
| 4,082,028 | 4/1978 | Deutsch | 84/1.24 |
| 4,103,581 | 8/1978 | Deutsch | 84/1.24 |

*Primary Examiner*—S. J. Witkowski
*Attorney, Agent, or Firm*—Trexler, Wolters, Bushnell & Fosse, Ltd.

[57] ABSTRACT

A portamento system is disclosed for use with an electronic musical instrument, and particularly with a monotonic keyboard instrument which utilizes master oscillator/divider elements for tone generation. The portamento system utilizes a voltage controlled oscillator, and an oscillator control circuit comprising a unique combination of a phase/frequency detector and a circuit for varying and controlling lock up rate and expanding the frequency range of the system which may be either a ramp and hold circuit or a frequency tachometer circuit. The voltage controlled oscillator is thus locked on to the input frequency from the electronic musical instrument with substantially zero phase and frequency error. The system is capable of reaching the input frequency as slowly or as rapidly as desired and will operate over a wide frequency range. A unique system control and interfacing system is also provided whereby the portamento system may be utilized with a plurality of voices of the electronic musical instrument and several modes of operation may be selectively utilized.

19 Claims, 7 Drawing Figures

VARIABLE RATE PORTAMENTO SYSTEM

BACKGROUND OF THE INVENTION

The present invention relates to a portamento system and more particularly to a variable rate three mode portamento system for use with electronic musical instruments. The disclosure is facilitated by describing the portamento system in conjunction with a keyboard instrument which utilizes master oscillator/divider elements for tone generation.

Portamento is a musical term defined as the passage from one tone to another in a continuous glide or progression through the intervening tones.

In keyboard instruments which utilize a master oscillator/divider, tones are generated only at discrete frequency intervals. Therefore, in order to obtain the continuous glide or progression through frequencies required for a portamento effect, a separate system having its own oscillator must be provided. In order for the portamento effect to be effectively utilized, it must be controlled from the keyboard of the electronic musical instrument with which it is being used. Thus, a voltage controlled oscillator (VCO) deriving its control voltage directly from the keyboard of the electronic musical instrument or from a frequency to voltage converter connected thereto could be used to provide the continuous glide or tone progression characteristic of the portamento affect. However, the frequency output of such a system will be related only indirectly to the main tone generator system of the electronic musical instrument, and therefore some amount of frequency error will always be present.

One approach to eliminating the frequency error as disclosed herein is to use a phase-locked loop integrated circuit in conjunction with a free running voltage controlled oscillator (VCO) to lock up the frequency output thereof with a desired input frequency from the electronic musical instrument with a minimal amount of phase error. However, phase-locked loop integrated circuits operate over only a relatively limited frequency range when used without external drive circuitry and do not have any means of controlling the lock up rate, which rate corresponds to the rate at which the portamento effect glides or progresses between its beginning and ending tones. Thus, previous portamento systems have generally been limited to only one sine wave footage or voice representing a relatively limited frequency range from a keyboard instrument, and have further generally been limited in producing satisfactory glide rates.

Thus, it would be desirable to provide a portamento system which can be utilized with a plurality of voices of an electronic musical instrument, having a relatively broad frequency range and satisfactorily operable at a wide range of speeds which may be selectively chosen to give speeds as fast or as slow as desired to meet the requirements of specific musical applications.

Also, previous portamento systems have generally been limited to two modes of operation, namely, "on" or "off". It is desirable in this regard to provide a portamento system having additional modes of operation to meet the requirements of a variety of musical applications.

OBJECTS AND SUMMARY OF THE INVENTION

It is an object of the present invention to provide a portamento system for use with an electronic musical instrument whose output frequency is controlled by the electronic musical instrument with substantially zero frequency or phase error.

Another object of the present invention is to provide a portamento system for use with an electronic musical instrument which can be utilized with a plurality of voices without requiring additions or modifications to the circuitry of the electronic musical instrument to do so.

A further object of the present invention is to provide a portamento system for use with a keyboard electronic musical instrument incorporating three modes of operation, whereby the user may select, in addition to portamento either on or off, portamento with legato, portamento with detached playing or portamento with both legato and detached playing.

A still further object of the present invention is to provide a portamento system for use with an electronic musical instrument in which a wide range of portamento speeds is available from which the user may select.

Yet another object of the present invention is to provide a portamento system in accordance with the foregoing objects using integrated electronic circuit components to minimize the cost and difficulty of construction thereof and to allow a portamento system to be constructed according to the present invention which is of a relatively small size for convenience in installation thereof to cooperate with an electronic musical instrument with which it is to be used.

Briefly, a portamento system according to the present invention as described herein comprises a variable rate three mode portamento system. Although the portamento system according to the present invention may be modified without departing from the scope of the invention for use with a variety of electronic musical instruments, the disclosure will be facilitated by describing a portamento system being used in conjunction with a keyboard instrument which utilizes a master oscillator/divider element for tone generation.

The portamento system comprises a voltage controlled oscillator (VCO) and an oscillator control circuit comprising a phase detector and a circuit for varying and controlling lock up rate and expanding the frequency range of the system such as a ramp and hold circuit or a frequency tachometer and integrator circuit to control frequency and phase of the output signal of the VCO in accordance with a frequency signal input from the electronic musical instrument with which the portamento system is being used. The portamento system according to the present invention also includes a control and interface circuit comprising frequency divider circuits, mode selection and steering logic circuits and switching logic circuits. The control or interface circuit is provided with suitable connections to the electronic musical instrument for the proper cooperation therewith by the portamento system. The mode selection and steering logic of the control circuitry includes controls accessible to the user for turning the portamento on or off and for choosing one of three modes in which the portamento may be played. In the first mode, playing legato will operate the portamento system while playing detached will give normal operation; in the second mode playing legato will give normal operation while playing detached will operate the portamento system; in the third mode, the portamento system is operated regardless of how the keyboard is played. User controls are also provided for varying the portamento speed. A slide control makes an infinite variation in speed available within a predetermined range to give portamento speeds as fast or as slow as desired to meet the requirements of any specific musical application.

The foregoing as well as other objects and features of the present invention will become more apparent upon consideration of the following detailed descriptions when taken in conjunction with the drawings in which similar parts and components are designated by like numerals throughout.

DETAILED DESCRIPTION OF THE ILLUSTRATED EMBODIMENTS

Figure 1:
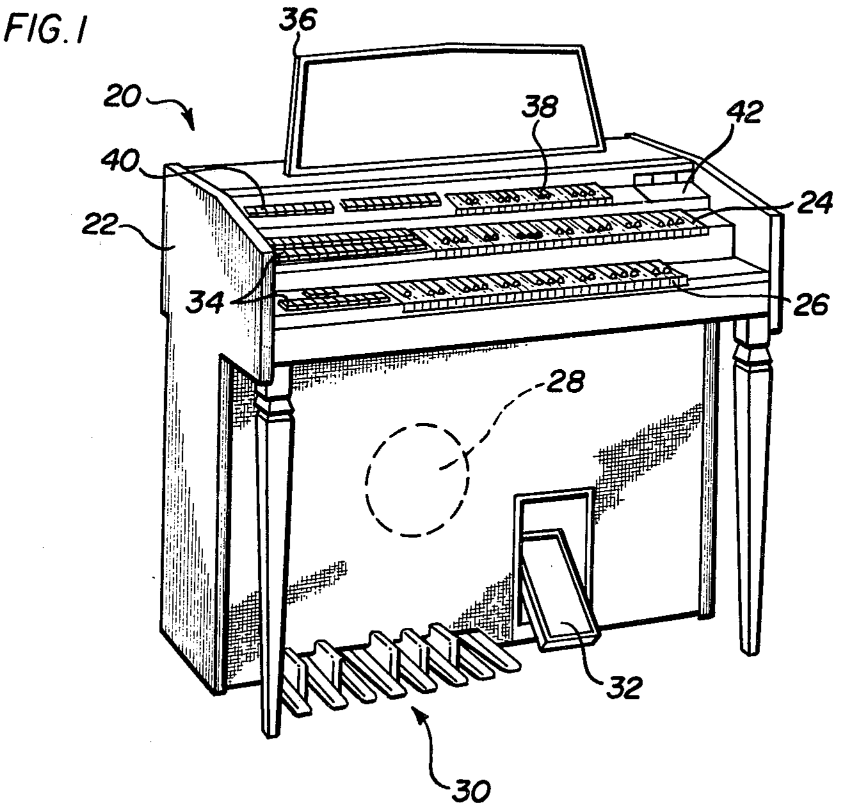
FIG. 1 is a perspective view of an organ including features of the present invention.

Referring first to FIG. 1, there is shown an electronic organ 20 having a case 22 with an upper keyboard 24 and a lower keyboard 26 in shortened, overlapping fashion, of the type generally known as a spinet organ. A suitable loudspeaker system 28 is provided behind a grill below the keyboard, and the organ is also provided with a one octave pedal board or clavier 30 and a swell pedal 32 for controlling overall volume. In addition, and generally in accordance with conventional practice, the organ is provided with stop tablets 34 generally on a level with the keyboards 24 and 26. Further, and also in accordance with conventional practice, the organ is provided with a music rack 36.

Departing from conventional practice, the organ is also provided with a two octave plus one, third keyboard 38 for producing novel effects, i.e., synthesizing. Stop tablets 40 are provided to the left of the keyboard 38 for operation and control of the synthesizer in conjunction with the keyboard 38. Additional controls 42 for the synthesizer are provided to the right of the keyboard 38. This keyboard 38 and the accompanying synthesizer are described in detail in U.S. Pat. No. 3,808,344 assigned to the same assignee as the present invention, and need not be described further herein. Suffice it to say that the keyboard 38 and accompanying synthesizer comprise a monotonic keyboard instrument which utilizes master oscillator/divider elements for tone generation.

Although it will be obvious from the following description that a portamento system in accordance with the present invention may be adapted for use in conjunction with any electronic musical instrument, the disclosure will be facilitated by describing a portamento system being used with a monotonic keyboard instrument and in particular with the keyboard 38 and accompanying synthesizer above described.

Figure 2:
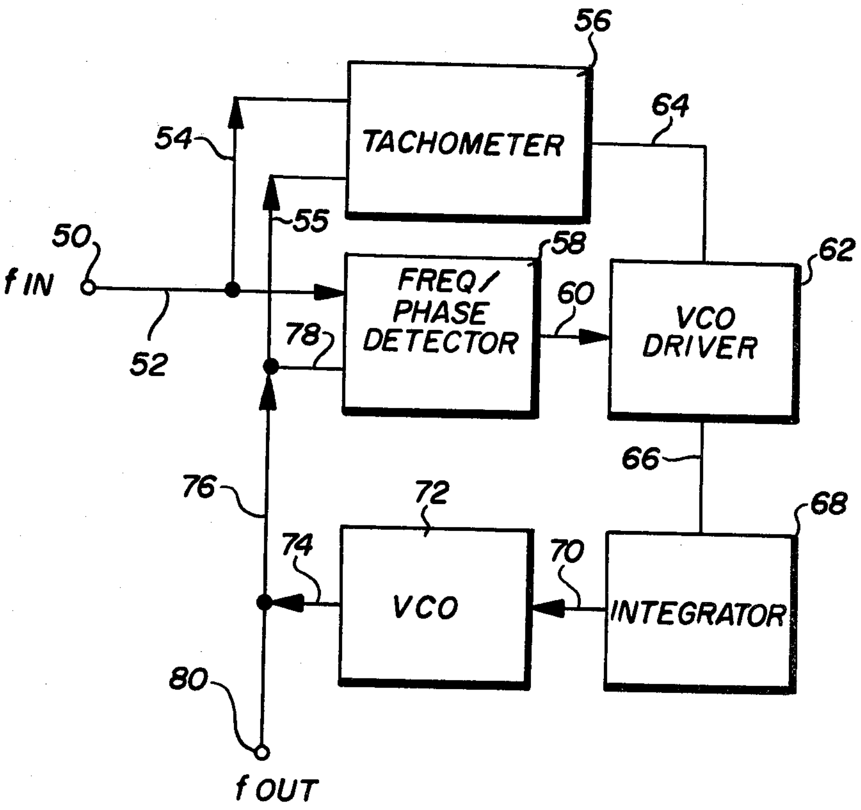
FIG. 2 is a block diagram of a first embodiment of a portion of a portamento system incorporating features of the present invention.

Attention should next be directed to FIG. 2 for a general illustration, in block diagramatic form, of a portion of a portamento system incorporating features of the present invention. An input frequency signal (f IN) to the portamento system at terminal 50 comprises a signal corresponding to the tone being played on the keyboard 38 in conjunction with the stop tablets 40 and other controls 42. This signal is connected by line 52 to one input of frequency phase detector 58. A voltage controlled oscillator (VCO) 72 has an output signal at terminal 74 connected by lines 76 and 78 to a second input of the frequency/phase detector 58. The detector 58 generates a control signal such as a series of pulses at its output terminal 60 whose pulse width is proportional to the phase difference between the two input signals above described. A tachometer circuit 56 is provided with two inputs connected in parallel with the inputs of the phase detector 58 by lines 54 and 55, respectively. The tachometer 56 generates a control signal such as a DC voltage at its output on line 64 which is proportional to the frequency difference between its two inputs, namely, the input signal from the electronic musical instrument and the input signal from the voltage controlled oscillator (VCO) 72. The output on line 60 of the detector 58 as well as the output on line 64 of the tachometer 56 are connected to a driver stage 62 which has its output on line 66 connected to an integrator circuit 68. The integrator circuit 68 converts the phase detector output to a DC voltage and integrates it with the DC control voltage from the tachometer 56 to provide a DC control voltage at its output 70 to control the frequency and phase of the VCO output signal to produce a portamento signal therefrom. The output 70 of the integrator circuit 68 is connected to the VCO 72, completing a closed loop configuration. Thus, the voltage controlled oscillator output signal will continue to change thereby producing a portamento signal, until it becomes equal in frequency and phase to the input signal from the electronic musical instrument at terminal 50.

Figure 3:
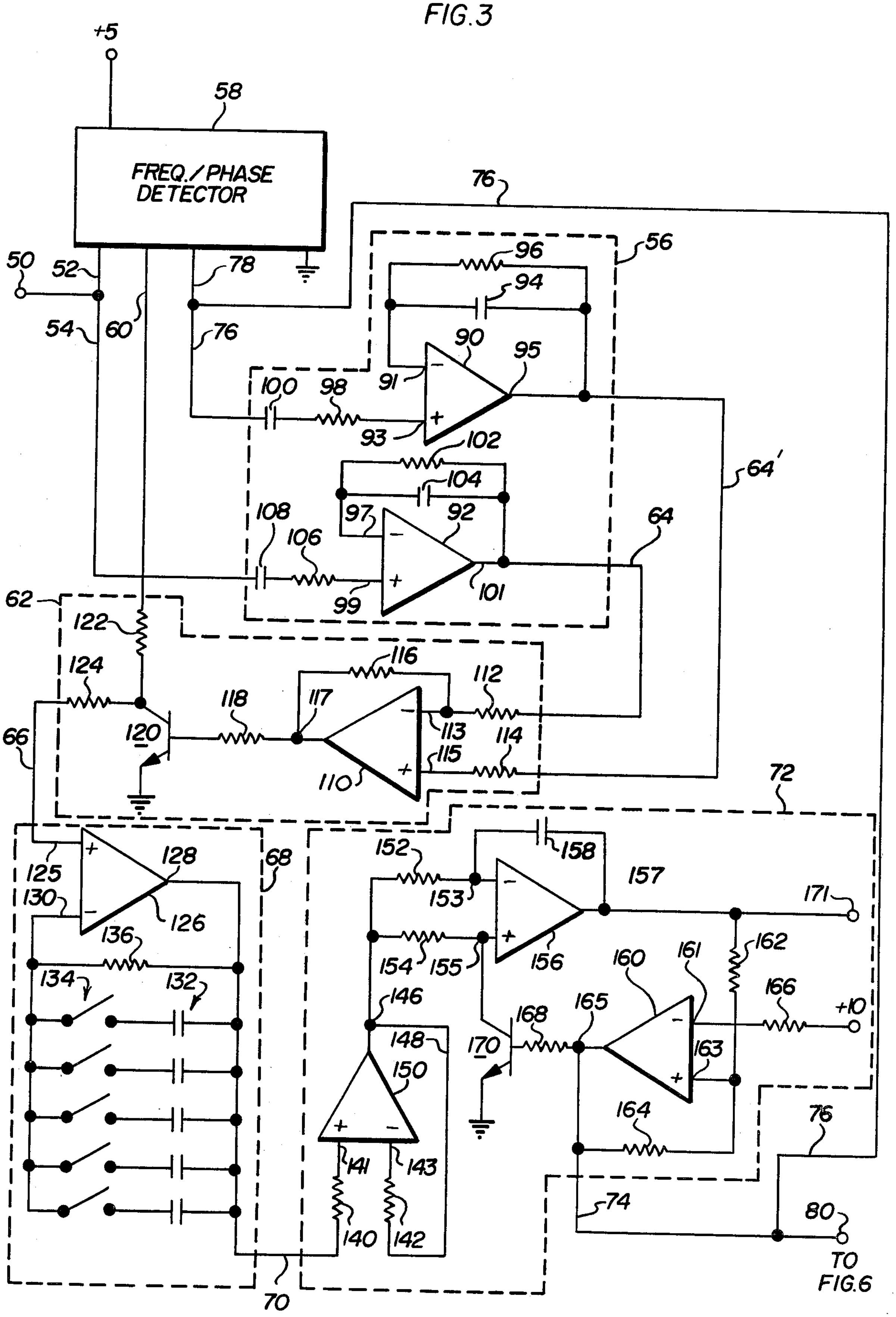
FIG. 3 is a circuit diagram showing in additional detail the elements of the block diagram of FIG. 2.

Referring now to FIG. 3 the circuitry of FIG. 2 is described in greater detail. The frequency-phase detector 58 is provided with a connection externally to a positive supply voltage. The input signal described above at terminal 50 is connected by line 52 to one input of the frequency/phase detector 58. The input signal at terminal 50 is also connected by lines 52 and 54 to an input of a tachometer circuit comprising operational amplifier 92, resistors 102 and 106 and capacitors 104 and 108. The signal on line 54 is connected to capacitor 108 which is connected in series with resistor 106 and positive input 99 of operational amplifier 92. Negative input 97 of operational amplifier 92 is connected to output 101 of operational amplifier 92 by a feedback circuit comprising resistor 102 and capacitor 104 in parallel. A second input of the frequency/phase detector 58 is connected by lines 78 and 76 to an output line 74 of the voltage controlled oscillator (VCO) 72, which will be described in detail below.

The frequency/phase detector 58 compares the two input wave forms on lines 52 and 78 already described, and provides a series of variable duty cycle pulses at its output on line 60 which are indicative of the frequency and phase difference between the two input signals.

The output line 74 of the VCO 72 is also connected by line 76 to an input of a tachometer circuit comprising operational amplifier 90, resistors 96 and 98 and capacitors 94 and 100. The structure of the tachometer circuit including integrated circuit 90 is identical to the structure of the tachometer circuit including integrated circuit 92 already described. The two tachometers have outputs on lines 64 and 64' respectively, which are fed to a difference amplifier comprising operational amplifier 110 and resistors 112, 114 and 116. The signal on line 64 corresponding to the signal from the electronic musical instrument is fed to resistor 112 which is connected in series with negative input 113 of operational amplifier 110. A signal on line 64' corresponding to the signal from the voltage controlled oscillator is fed to resistor 114 which is connected in series with positive input 115 of the operational amplifier 110. Negative input 113 of the operational amplifier 110 is connected to output 117 thereof by feedback resistor 116. The resultant output of the operational amplifier 110 at terminal 117 is connected to resistor 118 which is connected in series with the base of transistor 120. Transistor 120 has its collector connected to resistor 122 which is in series with an output on line 60 of the frequency/-phase detector 58, and its emitter tied to ground. The collector of transistor 120 is also connected to resistor 124 which is in series with an output line 66 of the aforementioned circuitry.

Thus, the aforementioned circuitry provides an output on line 66 in the following manner. The OP amp 110 functions as a difference amplifier for the signals from the two tachometer circuits. When the frequency of the signal from voltage controlled oscillator (VCO) 72 is higher than the frequency of the signal from the electronic musical instrument the output 117 of operational amplifier 110 is driven high, turning on transistor 120 and forcing the signal on line 66 low. Conversely, when the frequency of the signal from the electronic musical instrument is higher than the frequency from the VCO, the output at terminal 117 of the operational amplifier 110 is driven low, turning off transistor 120 and allowing the signal on line 66 high. The signal on line 66 is fed to positive input 125 of operational amplifier 126. Negative input 130 of the operational amplifier 126 is connected to output 128 thereof by a feedback circuit comprising, in parallel, resistor 136 and a plurality of switches 134 connected in series with a plurality of capacitors 132. The output at terminal 128 of operational amplifier 126 is also connected by line 70 to an input of the VCO circuit 72.

Operational amplifier 126 functions as an integrator, whose integration rate determines the latch up characteristic of the entire circuit. The smaller the value of the feedback capacitor 132 chosen by selective closure of switches 134, the faster the overall system response will be, and vice versa. The latch up rate of the system corresponds to portamento speed, thus, switches 134 provide a user control for choosing portamento speed. The output of the integrator on line 70 is connected to resistor 140 which is in series with positive input 141 of operational amplifier 150. Negative input 143 and output 146 of operational amplifier 150 are connected by feedback resistor 142. Operational amplifier 150 functions as a high impedance buffer amplifier at the input of the voltage controlled oscillator circuitry. The output 146 of operational amplifier 150 is connected to resistor 152 which is in series with negative input 153 of operational amplifier 156, and with resistor 154 which is in series with positive input 155 of operational amplifier 156. Feedback capacitor 158 is provided between output 157 and negative input 153 of the operational amplifier 156. The output 157 of the operational amplifier 156 is connected to resistor 162 which is in series with positive input 163 of operational amplifier 160. Negative input 161 of operational amplifier 160 is connected to resistor 166 which is in series with a positive voltage supply. Feedback resistor 164 is connected between the positive input 163 and output 165 of operational amplifier 160. Transistor 170 has its collector terminal connected to the positive input 155 of operational amplifier 156, its emitter terminal connected to ground and its base terminal connected to resistor 168 which is in series with the output 165 of operational amplifier 160.

The operational amplifiers 156 and 160, together with the associated circuitry above described comprise the voltage controlled oscillator. Operational amplifier 156 is used to integrate the DC control voltage from the preceeding circuitry, and operational amplifier 160 is connected as a Schmitt trigger to monitor the output of operational amplifier 156. The Schmitt trigger controls clamp transistor 170. This voltage controlled oscillator circuit configuration is known in the art and need not be described herein in further detail. Suffice it to say that the voltage controlled oscillator provides a pulse or square wave at its output on line 74 which is connected to line 76 which runs back to the phase frequency detector 58 and tachometer 56 as described above. Line 74 also provides the same output signal to terminal 80, which is connected to control and interface circuitry as will be described later herein. The voltage controlled oscillator also produces a triangular wave output at terminal 171 which is of constant amplitude, so that a simple wave shaping circuit may be used to obtain a sine wave output therefrom for various other applications.

Figure 4:
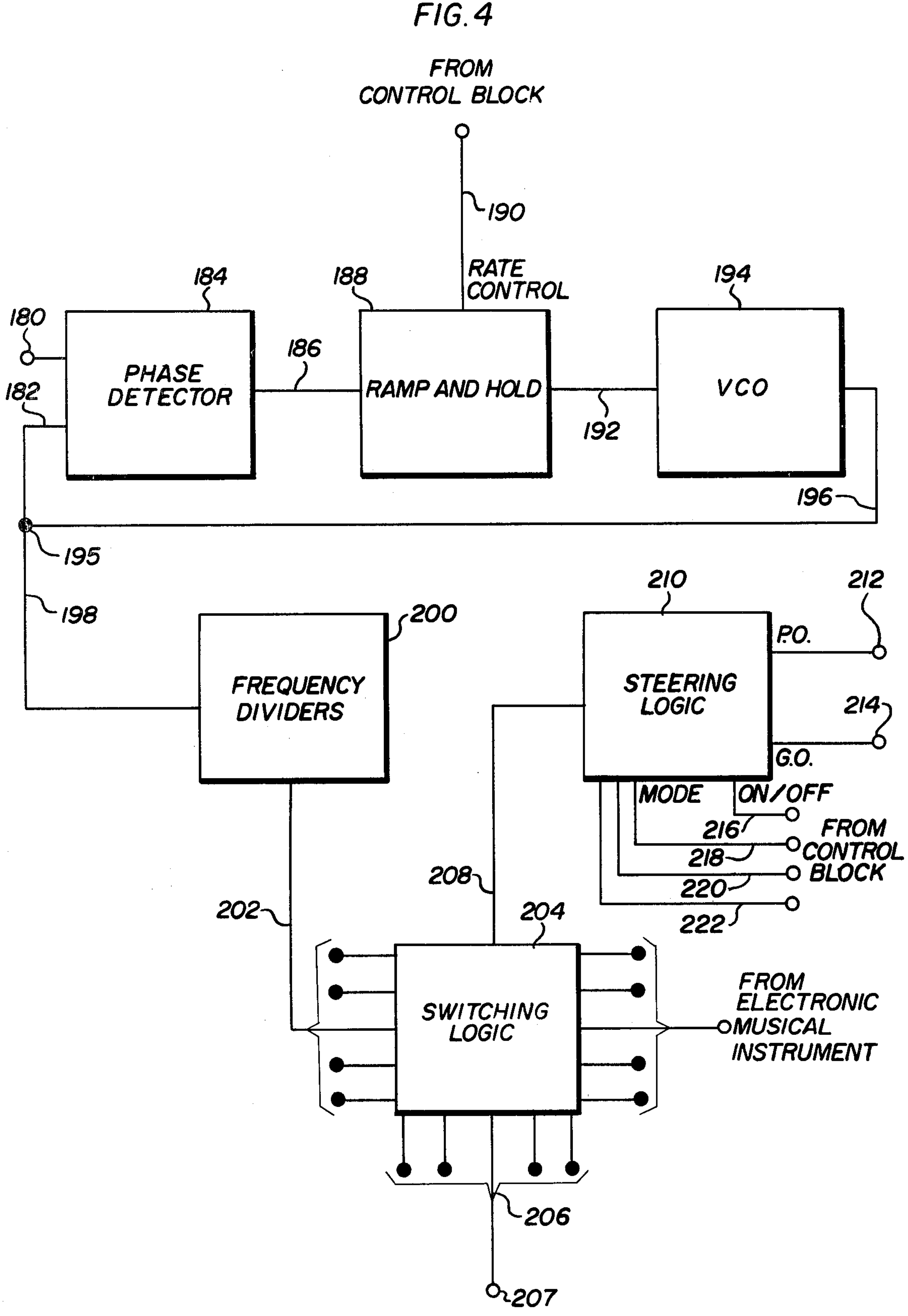
FIG. 4 is a block diagram of a portamento system incorporating features of the present invention.

Referring now to FIG. 4, a second embodiment of a portamento system incorporating features of the present invention is illustrated in block form. A signal from the electronic musical instrument corresponding to a note being played thereon is connected to terminal 180 to provide a first input signal for phase detector 184. A feedback circuit is used to provide a voltage controlled frequency signal or portamento signal, comprising phase detector 184 connected by line 186 to ramp and hold circuit 188 which is in turn connected by line 192 to voltage controlled oscillator 194. Line 196 completes the loop by connecting voltage controlled oscillator 194 to a second input 182 of phase detector 184. Portamento rate control is provided from a control block (not shown) on line 190 to the ramp and hold circuit 188. This circuit comprising phase detector 184, ramp and hold circuit 188 and VCO 194 in a second embodiment of the circuit of FIG. 2 and FIG. 3, and functions equivalently. The structure and function of the foregoing circuits will be described in detail below.

The voltage controlled frequency output signal of the foregoing circuitry at terminal 195 is connected by line 198 to frequency dividers 200 which are connected by line 202 to switching logic 204. A second input to switching logic 204 is provided on line 208 which is connected to steering logic 210. Suitable input signals to steering logic 210 are provided at terminals 212 and 214 from the electronic musical instrument, and on/off and mode controls are provided from a control block (not shown) on lines 216, 218, 220 and 222, respectively. The switching logic 204 has its output on line 206 connected to the electronic musical instrument at terminal 207. The control block, switching logic 204 and steering logic 210 provide a system control circuit for the portamento system and interfacing between the portamento system and the electronic musical instrument. These circuits are described in detail below. This control and interfacing circuit may also be used with the alternative embodiment of FIGS. 2 and 3 by connecting output 80 thereof to line 198 in place of output 195.

Figure 5:
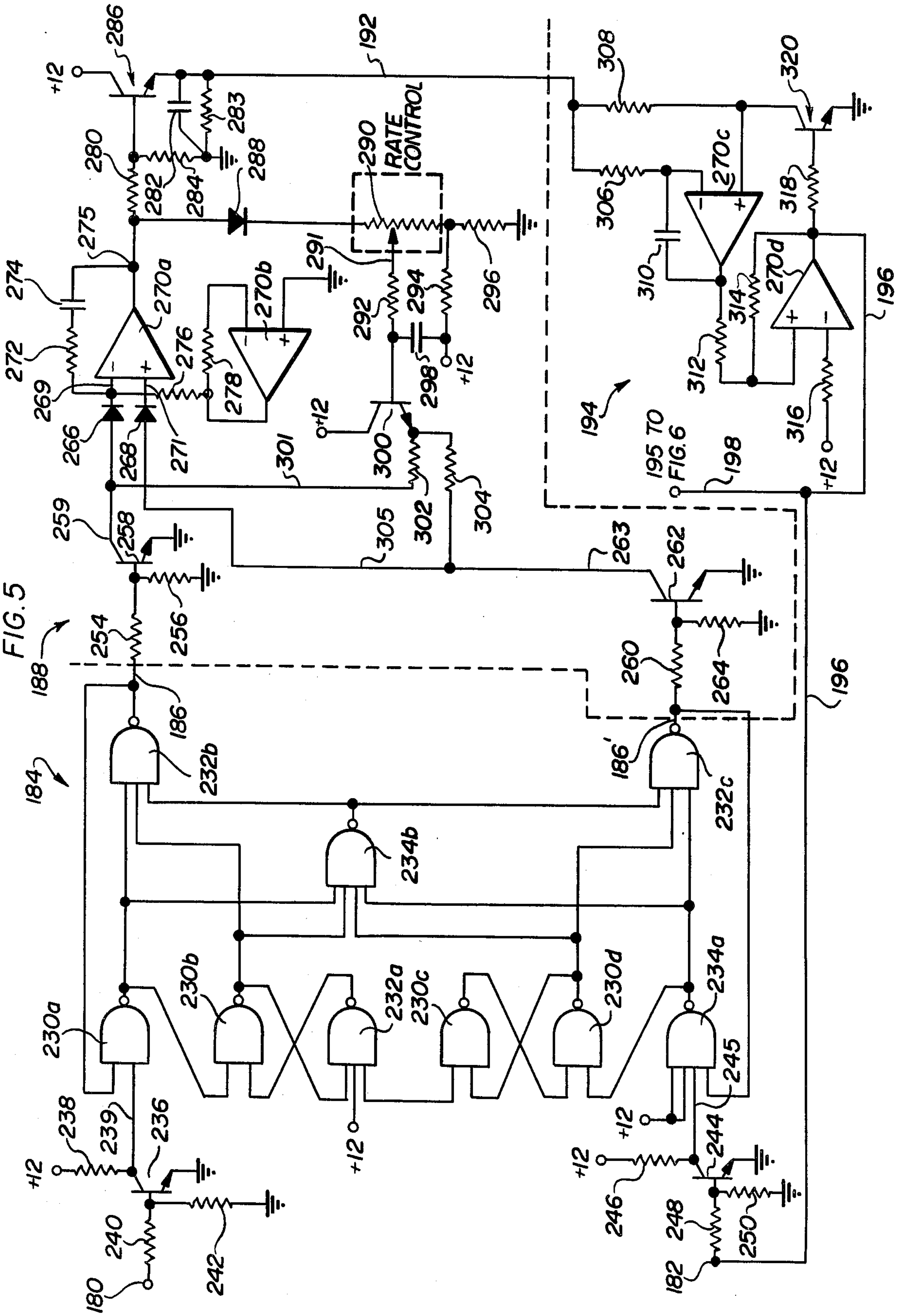
FIG. 5 is a circuit diagram showing additional detail of a portion of the block diagram of FIG. 4.

Referring now to FIG. 5, the phase detector 184, ramp and hold 188 and voltage controlled oscillator 194 circuits are illustrated in additional detail. The input signal from the electronic musical instrument at terminal 180 is connected to an input stage comprising transistor 236 and resistors 238, 240 and 242. Resistor 240 is connected between input terminal 180 and the base of transistor 236, resistor 238 is connected between a positive voltage supply and the collector of transistor 236 and resistor 242 is connected between the base of transistor 236 and ground. Transistor 236 has its emitter terminal connected to ground. The output signal from transistor 236 on its collector is connected by line 239 to one input of two input NAND gate 230A, which is one gate of a four gate integrated circuit package. Input terminal 182 is connected by line 196 to the voltage controlled oscillator 194 to receive the output signal therefrom. Terminal 182 is connected to an input stage comprising transistor 244 and resistors 246, 248 and 250 which is identical in structure and function to the input stage already described. The signal at the collector terminal transistor 244 is connected by line 245 to one input of four input NAND gate 234*a* which is one gate of a two gate integrated circuit package. The remainder of the phase detector circuit 184, comprising NAND gates 230*b*, 230*c*, 230*d*, 232*a*, 232*b*, 232*c* and 234*b* is identical in structure and function to the phase detector portion of a phase-locked loop integrated circuit generally designated MC4044.

The phase detector circuit 184 has two outputs on line 186 and 186′, respectively, which produce pulses proportional to the frequency error and phase error between the inputs 180 and 182 from the electronic musical instrument and VCO, respectively. Only one of the two outputs on lines 186 and 186′ can be carrying pulses at any given time. Which output has pulses depends on whether the VCO frequency is high or low (or if its phase leads or lags) with respect to the input frequency from the electronic musical instrument.

Line 186 is connected to a stage comprising transistor 258 which has its base connected to resistor 254 and series with line 186 and to resistor 256 whose other end is connected to ground. The function of transistor 258 will be described in detail below. Similarly, line 186′ is connected to a circuit comprising transistor 262 and resistors 260 and 264 which is identical in structure and function to the circuit including transistor 258 described above.

Transistor 258 has its output signal at collector terminal 259 connected to the anode of diode 266 which has its cathode connected to negative input 269 of operational amplifier 270*a*. The output signal at collector terminal 263 of transistor 262 is connected by line 305 to the anode of diode 268 which has its cathode connected to positive input 271 of operational amplifier 270*a*. A feedback loop comprising resistor 272 and capacitor 274 in series is connected between the negative input 269 and output 275 of operational amplifier 270*a*. The signal at the output 275 of operational amplifier 270*a* increases or decreases at a rate proportional to the value of capacitor 274 in the feedback loop and to the difference in current between the inputs. Current is supplied to the inputs by a DC voltage on resistors 302 and 304 which are connected by lines 301 and 305 to the anodes of diodes 266 and 268 at the negative and positive inputs, respectively, of operational amplifier 270*a*. Transistors 258 and 262 are used to short the inputs of operational amplifier 270*a* to ground depending on the output signals from the phase detector circuitry.

If the frequency of the signal from the VCO is low or lags in phase with respect to the frequency of the electronic musical instrument signal, a logical "1" signal will be on line 186, while a pulse train signal will be on line 186′. Thus, transistor 258 will be turned on shorting the negative input of operational amplifier 270*a* to ground, while transistor 262 will be turned on and off corresponding to the pulse train signal on line 186′. When transistor 262 is off current enters the positive input 271 of operational amplifier 270*a* causing its output signal at terminal 275 to ramp up. When the frequency of the VCO signal matches the frequency and phase of the electronic musical instrument input signal, the signals on lines 186 and 186′ are both at logical "1", and transistors 258 and 262 are both turned on, thus grounding both inputs of operational amplifier 270*a* so that the ramp and hold circuit output signal is in its "hold" state. If the frequency of the voltage control oscillator signal is high or leads in phase with respect to the frequency of the electronic musical instrument signal the result on the following circuitry is the converse of the above where the VCO signal frequency was lower, and the ramp and hold circuit output at terminal 275 of operational amplifier 270*a* ramps down. The resistor 272 in the feedback loop of operational amplifier 270*a* acts as a damper to prevent overshoot of the ramp function thereof.

When operational amplifier 270*a* is used in this ramp and hold function, it requires an external bias current on its negative input. Without this bias current the output would ramp up faster than down and in the "hold" state, it would drift steadily down. Therefore, operational amplifier 270*b*, which is provided with feedback resistor 278 between its negative input and its output and has its positive input tied to ground, supplies a suitable bias current to the negative input 271 of operational amplifier 270*a* through resistor 276.

The voltage controlled oscillator (VCO) 194 comprises operational amplifiers 270*c* and 270*d*, resistors 306, 308, 312, 314, 316 and 318, capacitor 310 and transistor 320. Operational amplifier 270*c* received the output signal of the ramp and hold circuit on line 192 through resistor 306 connected in series with its negative input and is provided with feedback capacitor 310 between its negative input and its output, while its positive input is connected to the collector terminal of transistor 320 and to resistor 308 whose other end is connected to line 192. Operational amplifier 270*d* has its positive input connected to resistor 312 which is in series with the output of operational amplifier 270*c*, its negative input connected to a positive voltage supply through resistor 316, feedback resistor 314 between its positive input and its output, and resistor 318 between its output and the base of transistor 320. Transistor 320 has its emitter tied to ground. Operational amplifier 270*c*, then, functions as a current integrator and operates in a similar manner to the ramp and hold operational amplifier 270*a*. Operational amplifier 270*d* functions as a Schmitt trigger controlling clamp transistor 320. Thus, when transistor 320 is turned on by the output of operational amplifier 270*d*, current is supplied only to the negative input of operational amplifier 270*c* causing its output to ramp down until the low switching point of the Schmitt trigger of operational amplifier 270*d* is reached, causing transistor 320 to turn off. When transistor 320 is turned off current is supplied to both inputs of operational amplifier 270*c*. Resistors 308 and 306 are chosen so that the positive input of operational amplifier 270*c* is supplied with twice as much current as its negative input causing the output to ramp up until the high switching point of the Schmitt trigger of operational amplifier 270*d* is reached.

The input signal for the VCO on line 192 is provided from the output signal of the ramp and hold circuit as follows. Resistors 280 and 284 form a voltage divider for the output signal at terminal 275 of operational amplifier 270*a*, which is isolated from the VCO by transistor 286. Since the VCO requires only a small voltage swing from the ramp and hold to cover the frequency range required for use with the synthesizer musical instrument described above, the divider gives the ramp and hold a larger operating range, providing greater immunity to noise and drift. Capacitor 282 and resistor 283 are connected in parallel from the emitter of transistor 286 to ground to filter out frequency difference between the electronic musical instrument and VCO frequency. The input to the VCO on line 192, then, is from the emitter terminal of transistor 286 which has its collector terminal connected to a positive voltage supply and its base terminal connected to the junction of resistors 280 and 284.

A circuit for varying portamento speed, which corresponds to the ramp rate of the ramp and hold circuit, is provided by a feedback loop between output 275 of the operational amplifier 270*a* and the anodes of diodes 266 and 268 whose cathodes are connected in series with the negative and positive inputs, 269 and 271, of operational amplifier 270*a*, respectively. The rate or speed control feedback loop comprises diode 288 whose anode is connected to terminal 275 and variable resistor 290 and resistor 296 connected in series between the cathode of diode 288 and ground, and a circuit comprising resistors 292, 294, 302 and 304, capacitor 298 and transistor 300. Transistor 300 has its base connected to resistor 292 which is in series with wiper arm 291 of the variable resistor 290. Resistor 294 is connected to the junction of variable resistor 290 and resistor 296 and has its opposite end connected to a positive voltage supply, and to one end of capacitor 298 whose other end is connected to the base terminal of transistor 300. Transistor 300 has its collector terminal connected to a positive voltage supply and its emitter terminal connected to resistors 302 and 304 whose opposite ends are connected by lines 301 and 305, respectively, to the anodes of diodes 266 and 268 at the negative and positive input terminals of operational amplifier 270*a*.

The VCO and ramp and hold circuits are both linear with respect to frequency. It is desirable, however, to have the portamento speed be linear not with respect to frequency but with respect to the notes of a typical keyboard instrument which are arranged in a scale of even temperament. To facilitate this, the rate of change of the VCO and therefore its control voltage provided by the rate of the ramping function of the ramp and hold circuit must be varied proportionately to the rate of change of frequencies of the scale of even temperament which is not, of course, linear with respect to frequency. If the ramp rate of the ramp and hold circuit is controlled to correspond to this frequency non-linear musical scale, then, the rate of the VCO will be properly compensated. The ramp rate of the ramp and hold is continuously adjusted in this fashion by the above described rate control circuit. The circuit functions to vary the DC control voltage on resistors 302 and 304 so that the ramp rate of the ramp and hold circuit will vary in the proper fashion. Thus, the ramp and hold output at terminal 275 is used as the DC control voltage which is made available at resistors 302 and 304 by the intervening circuitry described above. Capacitor 298 is included to provide a sufficient voltage pulse at power on to start the ramp and hold circuit. A user adjustable portamento speed control is also provided in this circuitry by the inclusion therein of variable resistor 290 which is a control accessible to the user. Variable resistor 290 is thus used to raise or lower the overall response level or ramp rate of the ramp and hold circuit while maintaining the aforementioned suitable relation between the ramping rate and the rate of the frequency change in the scale of even temperament.

The phase detector, ramp and hold and VCO circuits described above constitute an alternate embodiment to the circuitry described above in FIGS. 2 and 3. Either of these embodiments can, of course, be provided with appropriate interfacing and control cicuitry to cooperate with any electronic musical instrument which provides a suitable input frequency for the circuits to operate upon. The following description of control and interfacing circuitry of the protamento system according to the present invention will be facilitated, however, by illustrating and describing circuitry appropriate for use with a synthesizer instrument such as the synthesizer described in U.S. Pat. No. 3,808,344 assigned to the assignee of the present invention. Using this example, then, the inputs from the electronic musical instrument of FIGS. 2 and 3, and FIGS. 4 and 5, namely, terminals 50 and 180, respectively, are connected to a signal corresponding to a two foot voice of the synthesizer. Therefore, the output signals of the VCO's of FIGS. 2 and 3, and FIGS. 4 and 5 at terminals 80 and 195, respectively, also correspond to the two foot voice.

Figure 6:
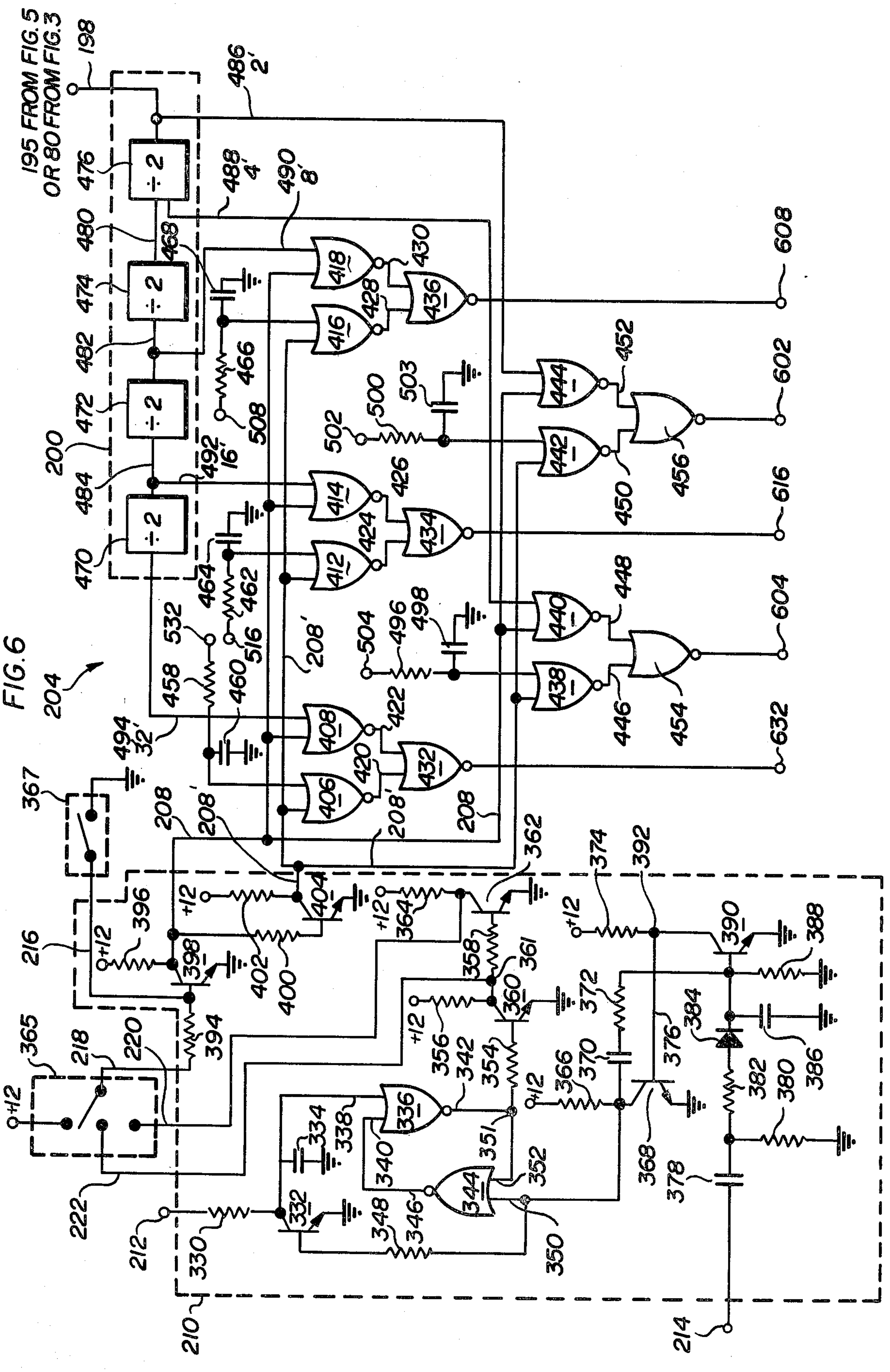
FIG. 6 is a circuit diagram showing additional detail of the remainder of the elements of the block diagram of FIG. 4.

Referring now to FIG. 6, the aforementioned VCO output from either terminal 195 of FIG. 5 or terminal 80 of FIG. 3 is connected to line 198 as shown in the upper right hand corner of the drawing. The frequency dividers 200 comprise a multiple stage divider comprising divide-by-two circuits 470, 472, 474, and 476 connected in series, connected to the VCO output on line 198. Thus, the signals at the various outputs of the dividier chain are harmonically related portamento signals corresponding to several footage voices as follows: a two foot signal on line 486, a four foot signal on line 488, an eight foot signal on line 490, a sixteen foot signal on line 492 and a thirty-two foot signal on line 494. Signals from the synthesizer similarly comprising several footage voices are connected as follows: a two foot signal at terminal 502, a four foot signal at terminal 504, an eight foot signal at terminal 508, a sixteen foot signal at terminal 516 and a thirty-two foot signal at terminal 532.

Switching logic 204 comprises a plurality of identical logic circuits, one of which is provided for each of the footage voices thus, only one such circuit will be described in detail. The portamento signal corresponding to a thirty-two foot voice is produced at the output of divider 470 on line 494. This signal is connected to one input of two input gate NOR 408, which has its output 442 connected to one input of two input NOR gate 432. A signal from the synthesizer corresponding to a thirty-two foot voice at terminal 532 is connected to resistor 458 which is in series with one input of two input NOR gate 406 whose output 420 is connected to the other input of two input NOR gate 432. Capacitor 460 is provided between the junction of resistor 458 with gate 406 and ground. Gate 432 has its output connected to terminal 632 which is connected back to the circuitry of the synthesizer. The opposite inputs of gates 406 and 408 are connected to steering logic 210, which will be described below, which ultimately determines whether the portamento signal or the synthesizer signal will be fed back for voice selection and audio reproduction to the synthesizer circuitry at terminals 602, 604, 608, 616 and 632.

The steering logic 210 of the control and interfacing circuitry is shown in detail in the left hand portion of FIG. 6. Input signals at terminals 212 and 214 are from the synthesizer. NOR gates 336 and 344 form a flip-flop, one input of which, at terminal 338 of gate 336, is triggered by a pulse signal from the synthesizer at terminal 212 when a key on the keyboard of the synthesizer is depressed. Terminal 212 is connected to resistor 330 in series with terminal 338. The other input to the flip-flop, terminal 350 of gate 344, is connected to input terminal 214 via a one shot circuit comprising transistors 368 and 390, resistors 366, 372, 374, 380, 382 and 388, capacitors 370, 378 and 386 and diodes 384. Transistor 332 has its base connected to resistor 348 which is in series with input terminal 350 of gate 344, its collector terminal connected to input terminal 388 of gate 336 and its emitter connected to ground. Input terminal 340 of gate 336 is connected to output terminal 346 of gate 344 and input terminal 352 of gate 344 is connected to output terminal 342 of gate 336 completing the flip-flop circuit and forming an output thereof at terminal 351.

When a key on the keyboard of the synthesizer is depressed a gate signal from the synthesizer at terminal 214 goes high and the pulse signal from the synthesizer at terminal 212 produces a single pulse. The gate signal at terminal 214 triggers the following one shot which produces a single pulse at terminal 350, triggering the flip-flop and turning on transistor 332 to ground the other input 338 of the flip-flop. The output of gate 336 will then be high. If the key is released before another key is depressed, as in detached playing, the above procedure will repeat and gate 336 will remain high. If the key is held down while another key is depressed, as in legato playing, the outputs of the flip-flop will reverse. This is true because the gate input at terminal 214 remains high whenever a key switch is closed, thus providing no trigger pulse for the one shot when a second key is depressed before releasing the first key. Thus, two keyboard controllable logic states are provided at the output terminal 351 of the flip-flop.

Transistor 360 has its collector terminal 361 connected to resistor 356 which is in series with a positive voltage supply, its emitter terminal connected to ground and its base terminal connected to resistor 354 which is in series with the output terminal 351 of the flip-flop. This stage provides a suitable logic output signal at terminal 361 for the following stages. Which type of playing, legato or detached, will cause the switching logic to put out portamento signals is determined by a control block comprising mode switch 365 and on-off switch 367, and the steering logic circuitry which comprises an additional portion of the system control circuit. Transistor 362 has its base connected to resistor 358 whose other end is connected to terminal 361, which is in turn connected via line 222 to one terminal of mode switch 365, its emitter connected to ground and its collector connected to a positive voltage supply via resistor 364 and connected via line 220 to a second terminal of mode switch 365. When mode switch 365 is actuated to connect line 218 with line 222, transistor 362 is taken out of the circuit and the signal on terminal 361 is fed through to line 218. Transistor 398 has its base connected to line 218 via resistor 394, its emitter connected to ground and its collector connected to a positive voltage supply via resistor 396. Transistor 404 has its base connected via resistor 400 to the collector of transistor 398, its emitter connected to ground and its collector connected via resistor 402 to a positive voltage supply. The collector of transistor 398 is connected via lines 208 to the opposite input of two input NOR gate 408 whose first terminal, as described above is connected to the signal from the portamento divider chain representing a thirty-two foot voice. In similar fashion, lines 208 are also connected to the opposite inputs of two input NOR gates 414, 418, 440, and 444 which similarly have their first inputs connected to the signal lines from the other elements of the divider chain which produce signals corresponding to the remaining footage voices as described above. Transistor 404 has its collector terminal connected via line 208' to the opposite input of two input gate 406 which receives the signal representing the thirty-two foot voice from the synthesizer as described above. Similarly, lines 208' and connect the signal from the collector of transistor 404 to the opposite inputs of two input NOR gates 412, 416, 438 and 442 whose first inputs are connected to receive other signals corresponding to the other footage voices of the synthesizer, as described above. Thus, when line 218 is connected to line 222, detached playing will cause the output at terminal 351 to go high, as already described, and the logic network comprising transistors 360, 398, and 404 described above will turn off portamento signal gates 408, 414, 418, 440 and 444, and turn on the synthesizer signal gates 406, 412, 416, 438 and 442. This will cause synthesizer signals only to be gated through back to the synthesizer at terminals 602, 604, 608, 616 and 632. Legato playing, when line 218 is connected by switch 365 to line 222 will cause reverse logic to be fed through the aforementioned logic circuitry, causing the synthesizer signal gates to be turned off and the portamento signal gates to be turned on. This results in portamento signals only being gated through back to the synthesizer circuitry at terminals 602, 604, 608, 616 and 632.

When switch 365 is actuated to connect line 218 to line 220, at the collector of transistor 362, the logic signals are reversed by transistor 362, and the converse occurs. That is, detached playing will cause portamento signals to be fed back to the synthesizer circuitry while legato playing will result in only synthesizer signals without portamento being fed through back to the synthesizer circuitry. When switch 365 is actuated to connect line 218 to a positive voltage supply, the portamento signal gates are turned on and the synthesizer signal gates are turned off resulting in portamento signals being fed through back to the synthesizer regardless of whether the keyboard is played in legato or detached fashion.

Switch 367 is connected by line 216 to the base of transistor 398, and functions as an on-off switch for the portamento system. When switch 367 is in open position it has no effect on the circuitry which operates under the control of the mode switch 365 as described above. When switch 367 is closed it connects the base of transistor 398 to ground, causing the synthesizer signal gates to be turned on and the portamento signal gates to be turned off via the logic circuits of transistors 398 and 404 and lines 208, 208', 210 and 212 as described above. Thus, only synthesizer signals are gated through back to the synthesizer while the portamento signals are in effect turned off regardless of the mode of playing or the position of the mode selector switch 365.

Figure 7:
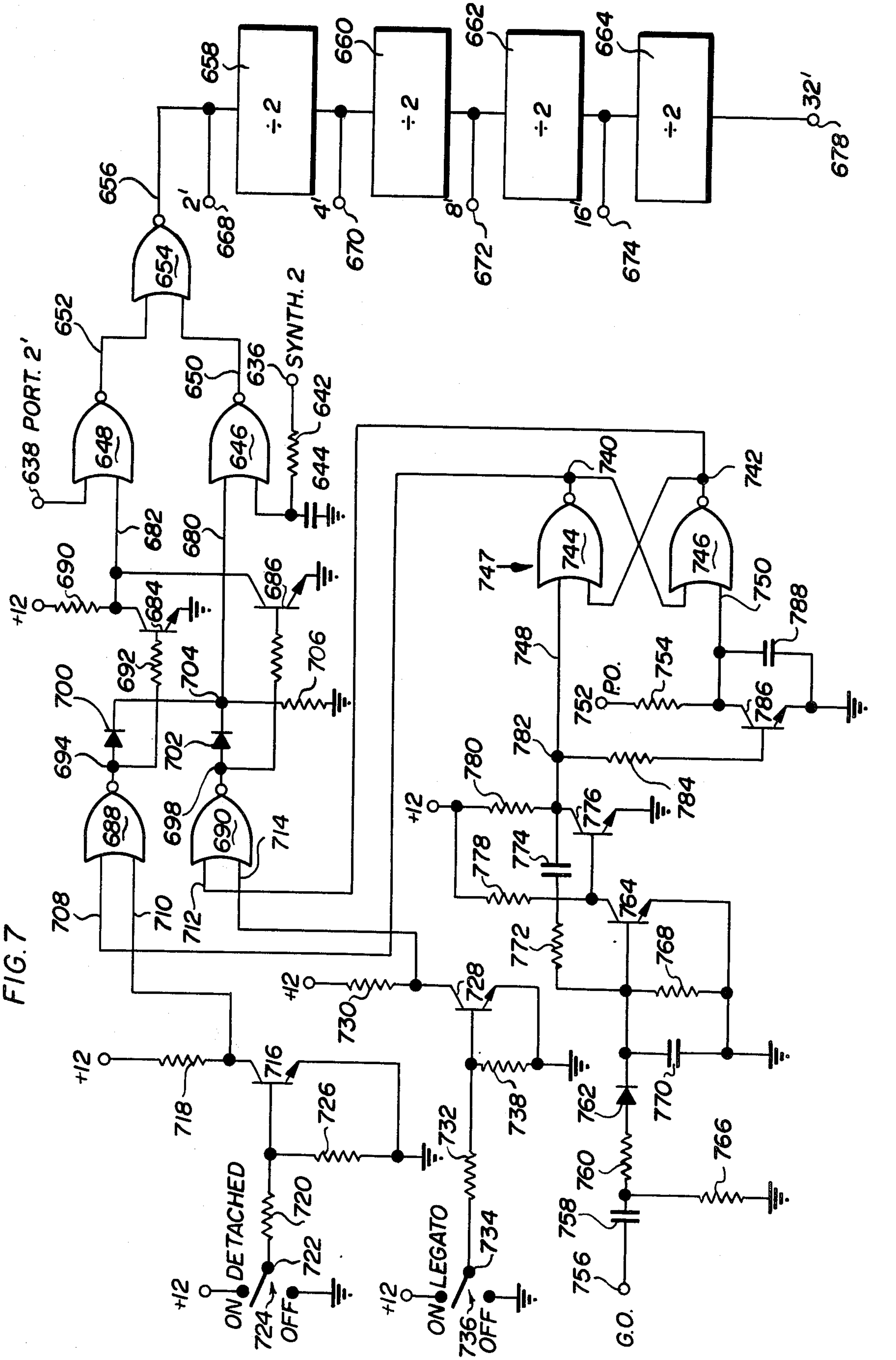
FIG. 7 is a circuit diagram of an alternate embodiment of the elements of FIG. 6.

Turning now to FIG. 7, an alternate embodiment of the control and interface circuitry including the steering logic, switching logic and frequency dividers of FIG. 6 is illustrated in detail. In the circuit of FIG. 7, only a single footage frequency signal from the synthesizer is required, which is connected at input terminal 636, and is a two foot frequency signal. The VCO output or portamento signal, which, similarly, is a two foot frequency signal, is connected at input terminal 638. This signal is obtained from either terminal 195 of the VCO or portamento circuit of FIG. 5 or alternatively from terminal 80 of the portamento circuit of FIG. 3. The two foot synthesizer signal at terminal 636 is connected in series with resistor 642 to a first input of a two input NOR gate 646. A capacitor 644 is connected between the first input of gate 646 and ground. Similarly, the two foot portamento signal at terminal 638 is connected to a first input of a two input NOR gate 648. The outputs of NOR gates 646 and 648 are connected by lines 650 and 652, respectively, to first and second inputs of a two input NOR gate 654, which has an output on line 656 connected to an input of a frequency divider chain comprising, in series, divide-by-two circuits 658, 660, 662 and 664. Output terminal 668 is connected at the input of divider 658 and carries a two foot frequency signal. Similarly, output terminals 670, 672, 674 and 678 are connected to the outputs of frequency dividers 658, 660, 662 and 664, respectively, and carry four foot, eight foot, sixteen foot and thirty-two foot signals generated by the respective, series connected, dividers. The output terminals 668, 670, 672, 674 and 678 are equivalent to the outputs 602, 604, 608, 616 and 632 of FIG. 6, in that they are connected back to the synthesizer circuitry to carry their respective portamento or synthesizer footage signals to appropriate selector or switching circuitry and audio output circuits of the synthesizer (not shown). Thus, whether a synthesizer signal or a portamento signal will ultimately be returned to the synthesizer as described above, depends upon which input signal, the synthesizer signal at terminal 636 or the portamento signal at terminal 638, is gated through the logic network comprising NOR gates 646, 648 and 654. This in turn depends on the signals at the opposite inputs 680 and 682 of NOR gates 646 and 648, respectively. Specifically, when a logic "0" is present at the input 682 of the gate 648 and a logic "1" is present at the input 680 of the gate 646, the portamento signal at terminal 638 will be gated through the gates 648 and 654 to the frequency dividers, and the synthesizer signal at terminal 636 will be, in effect, "turned off" at the gate 646. Conversely, when the signal at the input 682 of the gate 648 is at logic "1" and the signal at the input 680 of FIG. 8 646 is at logic "0", the synthesizer signal at terminal 636 will be gated through the gates 646 and 654 to the input line 656 of the frequency dividers and the portamento signal at terminal 638 will be, in effect, "turned off" by gate 648.

The remaining circuitry of FIG. 7, which is described in detail hereinbelow, limits the logic network comprising the gates 646, 648 and 654 to the two conditions described above, and further provides means for the user to select either of the above conditions for playing the synthesizer with or without portamento as desired.

The logic signals at terminal 680 and 682 are determined by a circuit comprising transistors 684 and 686 and NOR gates 688 and 690. Transistors 684 and 686 have their collectors connected to the input 682 and to a suitable biasing resistor 690 in series with a positive voltage supply, and their emitters tied to ground. The base of transistor 684 is connected in series with a resistor 692 to an output terminal 694 of a NOR gate 688. The base of transistor 686 is connected in series with a resistor 696 to an output terminal 698 of a NOR gate 690. A pair of diodes 700 and 702 have their anodes connected to output terminals 694 and 698 of the gates 688 and 690, respectively, and their cathodes connected to a terminal 704 which is connected to the input 680 of the gate 646. A biasing resistor 706 is connected between the terminal 704 and ground. Thus, if either terminal 694 or terminal 698 is at logic "1", input terminal 682 of the gate 648 will be at logic "0" and input 680 of the gate 646 will be at logic "1". When both terminals 694 and 698 are at logic "0", input 682 of the gate will be at logic "1" and input 680 of the gate 646 will be at logic "0". The gate 688 is a two input NOR gate having inputs on lines 708 and 710, respectively. Similarly, the gate 690 is a two input NOR gate having inputs on lines 712 and 714, respectively. The logic signals at terminals 694 and 698 are therefore controlled by the signals at inputs 708 and 710 of gate 688 and at inputs 712 and 714 of the gate 690 respectively.

Input line 710 is connected to the collector terminal of transistor 716 which is connected to a suitable biasing resistor 718 in series with a positive voltage supply. Transistor 716 has its emitter tied to ground and its base connected in series with a resistor 720 to a terminal 722 of a switch 724 and in series with resistor 726 to ground. The switch 724 is labeled as "detached", as will be explained in detail below. The switch 724 may be selectively actuated to connect terminal 722 either to a positive voltage supply or to ground. When terminal 722 is connected to the positive voltage supply the transistor 716 is turned on, resulting in a logic "0" at its collector and thus at input 710 of the gate 688. Similarly, when terminal 722 is connected to ground, transistor 716 is turned off, resulting in a logic "1" at its collector and therefore at input 710.

Similarly the input 714 of the gate 690 is connected to the collector terminal of transistor 728 which is provided with a suitable biasing resistor 730 to a positive voltage supply, has its emitter tied to ground, and has its base connected in series with a resistor 732 to a terminal 734 of a switch 736 and in series with a resistor 738 to ground. The switch 736 is labeled "legato", as will be explained below. In the same manner as switch 724 described above, switch 736 may be selectively activated to connect terminal 734 with a positive voltage supply or ground. When terminal 734 is connected to the positive voltage supply transistor 728 is turned on, resulting in a logic "0" signal at input 714 of the gate 690. Similarly when terminal 734 is connected to ground, transistor 728 is turned off resulting in a logic "1" signal at input 714 of the gate 690.

The opposite inputs 708 and 712 of the gates 688 and 690, respectively, are connected to outputs 740 and 742 of NOR gates 744 and 746, respectively, which are connected as an RS flip-flop 747. The flip-flop 747 has inputs on lines 748 and 750 which comprise inputs to the NOR gates 744 and 746 respectively. Input signals to input lines 748 and 750 of the RS flip-flop 747 are generated as follows.

A terminal 752 is connected to the pulse signal output (PO) from the synthesizer, which is the same signal as described above at terminal 212 of FIG. 6. The terminal 752 is connected in series with a resistor 754 to the input line 750 of the gate 746, which is one input of the RS flip-flop 747. Referring now to the left-hand side of FIG. 7, a terminal 756 is connected to receive the gate output signal from the synthesizer (GO) which is the same signal described above at terminal 214 of FIG. 6. The terminal 756 is connected in series with a capacitor 758 and a resistor 760 to the anode of a diode 762 whose cathode is connected to the base terminal of a transistor 764. A resistor 766 is connected between the junction of capacitor 758 and resistor 760 and ground. A resistor 768 and a capacitor 770 are connected between the base of the transistor 764 and ground. The base of the transistor 764 is connected in series with a resistor 772 and a capacitor 774 to the collector terminal of a transistor 776. The transistors 764 and 776 have their emitters tied to ground, and their collectors biased by suitable resistors 778 and 780, respectively, from a positive voltage supply. Thus, the transistors 764 and 776 and their associated circuit elements are connected to form a monostable circuit which has its output at or terminal 782. The terminal 782 is connected to the input line 748 of the gate 744 of the RS flip-flop 747 and is connected in series with a resistor 784 to the base of a transistor 786. The transistor 786 has its emitter tied to ground and its collector connected to the input line 750 of the gate 746 of the flip-flop 747. A capacitor 788 is connected between the collector and emitter of the transistor 786.

The foregoing circuitry operates as follows. Whenever a synthesizer key is depressed, a positive voltage signal appears at terminal 756 (G.O.) for as long as the key is held down. Similarly, when a synthesizer key is depressed, a positive pulse appears on terminal 752 (P.0.). This pulse at terminal 752 is produced by the synthesizer every time a key is depressed even if other keys are being held down. Capacitor 758 will cause the signal at terminal 756 to pulse the monostable circuit resulting in a positive pulse at terminal 782 which turns on transistor 786 thus, in effect, turning off the pulse from terminal 752, which results in a logic "1" at input 748 and a logic "0" at input 750 of the flip-flop 747. Thus, output terminal 740 of the flip-flop 747 is at logic "0" and output 742 of the flip-flop 747 is at logic "1". If the key just played is held down while another key is depressed, capacitor 758 is held charged by the continuing voltage signal at terminal 756 and therefore does not produce another pulse to the monostable, which in turn, does not produce a pulse to transistor 786, and therefore, the pulse produced by the second key closure at terminal 752 will appear on input 750 of the flip-flop 747. Thus, the flip-flop will be toggled, causing output 742 to go to a logic "0" and output 740 to go to a logic "1".

In accordance with the foregoing descriptions, then, the switches 724 ("detached") and 736 ("legato") may be used to control whether synthesizer signals or portamento signals are fed back to the synthesizer for audio reproduction in accordance with one of four possible modes of operation.

In the first mode, the "detached" swich 724 is activated to connect terminal 722 to the positive voltage and the "legato" switch 736 is activated to connect terminal 734 to ground. Thus, a logic "0" is at input 710 of the gate 688 and a logic "1" is at input 714 of gate 690. When a synthesizer key is depressed, a positive pulse appears at input 748 of the flip-flop 747 resulting in a logic "0" at output 740 thereof, and thus at input 708 of gate 688. At the same time, as described above, a logic "1" results at output 742 of the flip-flop 747 and thus at input 712 of the gate 690. These logic signals will remain as long as the synthesizer keys are depressed one at a time or in a "detached" playing fashion. With logic "0" at both inputs 708 and 710 of gate 688, its output at terminal 694 becomes a logic "1". The logic "1" at input 712 of the gate 690 causes its output terminal 698 to remain at logic "0". Thus, with a logic "1" at terminal 694 and a logic "0" at terminal 698, the portamento signal at terminal 638 will be gated through the gates 648 and 654 to the divider chain and thus back to the synthesizer as described above. However, if a first depressed key is held down while a subsequent key is depressed as in "legato" playing, a positive pulse will appear on input 750 of the gate 746, as described above, causing the flip-flop 747 to toggle and resulting in a logic "1" on output 740 of the flip-flop 747 and thus on input 708 of the gate 688. This will cause a logic "0" on output terminal 694 of the gate 688 and thus, with logic "0" on both terminals 694 and 698, the portamento signal at terminal 638 will be in effect "turned off" as described above and the synthesizer signal at terminal 636 will be gated through the gates 646 and 654 to the divider chain and thus back to the synthesizer, as also described above. This constitutes a "detached" portamento mode.

In a second mode, the detached switch 724 is activated to connect terminal 722 to ground while the legato switch 736 is activated to connect terminal 734 to the positive voltage supply. This causes a logic "0" at input 714 of the gate 690 and a logic "1" at the input 710 of the gate 688. Thus, the output terminal 694 of the gate 688 will remain at a logic "0". When the synthesizer keys are played in a legato fashion, that is with a first key being held down while a subsequent key is depressed, the pulses at terminal 752 will toggle the flip-flop, in the fashion described above to cause a logic "0" on input 712 of the gate 690. This will cause a logic "1" at the output terminal 698 of the gate 690 and thus result in the portamento signal being gated through, as described above when there is a logic "1" at either terminal 698 or terminal 694. Conversely, when the synthesizer keys are depressed one at a time in "detached" playing fashion, the pulse signal at 752 is prevented from toggling the flip-flop, resulting in a logic "1" at output 742 of the flip-flop and thus at input 712 of the gate 690, which causes output terminal 698 thereof to go to logic "0". This in effect "turns off" the portamento signal from terminal 638 at the gate 648 and gates through the synthesizer signal at terminal 636, as described above. This constitutes a "legato" portamento mode.

In a third mode, detached switch 724 and legato switch 736 are activated to connect the positive voltage supply to both terminals 722 and 734. Thus, both input 710 of the gate 688 and 714 of the gate 690 will be at logic "0". Therefore, either output 694 of the gate 688 or the output 698 of the gate 690 will be at logic "1" depending on the condition of the flip-flop comprising gate 744 and 746. As described above, a logic "1" on either terminal 694 or terminal 698 will cause the portamento signal at terminal 638 to be gated through to the dividers and thus back to the synthesizer. Thus, the system will play portamento whether the keys are played in legato or detached fashion. This constitutes a "detached and legato" portamento mode.

In a final mode, detached switch 724 and legato switch 736 are activated to connect terminals 722 and 734 both to ground. With the switches 724 and 736 in this condition, input 710 of the gate 688 and input 714 of the gate 690 will both be held at logic "1". Thus, output terminal 694 of the gates 688 and 698 of the gate 690 will both be held at logic "0", regardless of the key closures and resultant flip-flop signals at the opposite input terminals thereof. Consequently, the portamento signal at terminal 638 will be in effect "turned off" at gate 648, and the synthesizer signal at terminal 636 will be gated through to the dividers and thus back to the synthesizer. This constitutes a "portamento off" mode.

The gates, operational amplifiers and dividers used in the above described portamento system are preferably integrated circuits. This will, of course, minimize the cost and difficulty of construction of the circuitry according to the present invention and will result in a portamento system of relatively small size for convenience in installation thereof in cooperation with an electronic musical instrument.

The specific examples of the invention as herein shown and described are for illustrative purposes only, and various changes will be apparent to those skilled in the art and will be understood as forming a part of the present invention insofar as they fall within the spirit and scope of the appended claims.

The invention is claimed as follows:

1. In an electronic musical instrument, including means for selectively producing a plurality of signals comprising a plurality of voices of a note being played, a portamento system comprising: a voltage controlled oscillator for producing a first input signal at a first frequency, said electronic musical instrument producing a second input signal at a second frequency, said second input signal comprising one of said voices, an oscillator control circuit connected to said voltage controlled oscillator and to said electronic musical instrument to receive said first and second input signals and to produce a control voltage in response thereto, said control voltage varying in accordance with the frequency difference between said first and second input signals so as to increase when the second frequency is greater than the first frequency and decrease when the first frequency is greater than the second frequency and being fed back to said voltage controlled oscillator for varying the frequency of said first input signal in the direction of said second frequency at a predetermined rate, said oscillator control circuit including means for controlling and for selectively varying said predetermined rate so that the varying frequency first signal is usable for producing an audible portamento effect of selectable rate until said first input signal becomes substantially equal in frequency with said second frequency.

2. In an electrical musical instrument according to claim 1, said portamento system further including a plurality of frequency divider circuits connected in series from said voltage controlled oscillator for providing a plurality of harmonics of said portamento signal, said plurality of harmonics corresponding to said plurality of voices of said note being played by said electronic musical instrument.

3. In an electronic musical instrument including means for selectively producing a plurality of signals comprising a plurality of voices of a note being played, a portamento system comprising: a voltage controlled oscillator for producing a first input signal at an initial frequency, said electronic musical instrument producing a second input signal at a second frequency, said second input signal comprising one of said voices, an oscillator control circuit connected to said voltage controlled oscillator and to said electronic musical instrument to receive said first and second input signals and to produce a control voltage in response thereto, said control voltage being proportional to the frequency difference between said first and second input signals and being fed back to said voltage controlled oscillator for varying the frequency of said first input signal in the direction of said second frequency at a predetermined rate to comprise a portamento signal, said oscillator control circuit including means for controlling said predetermined rate, until said first input signal becomes equal in frequency with said second frequency, said portamento system further including a plurality of frequency divider circuits connected in series from said voltage controlled oscillator for providing a plurality of harmonics of said portamento signal, said plurality of harmonics corresponding to said plurality of voices of said note being played by said electronic musical instrument and said portamento system further including a system control circuit connected to said frequency dividers and to said electronic musical instrument to selectively transfer either said portamento signal and said harmonics thereof from said frequency dividers or said plurality of voices back to said electronic musical instrument.

4. A portamento system for an electronic musical instrument comprising: a voltage controlled oscillator for producing a first input signal, said electronic musical instrument producing a second input signal, a frequency/phase detector circuit connected to said electronic musical instrument and to said voltage controlled oscillator for producing a first control signal proportional to the phase difference between said first and second input signals, a frequency tachometer circuit connected to said electronic musical instrument and to said voltage controlled oscillator for producing a second control signal proportional to the frequency difference between said first and second input signals, and an integrator circuit to integrate said first and second control signals to produce a control voltage, said control voltage being fed back to said voltage controlled oscillator for varying the frequency of said first input signal at a predetermined rate to produce a portamento signal therefrom until said first input signal becomes equal in frequency with second input signal.

5. A portamento system according to claim 4, said electronic musical instrument further including means for selectively producing a plurality of signals comprising a note being played in a plurality of voices, said second input signal comprising a note being played in one of said voices.

6. A portamento system according to claim 5, further including means accessible to the user to selectively adjust said predetermined rate of variation of said first input signal to produce a portamento signal therefrom of a desired speed.

7. A portamento system according to claim 6 wherein said rate adjusting means comprises a plurality of switches manually operable by the user to select one of a plurality of integration rates for said integrator circuit.

8. A portamento system according to claim 7 further including a plurality of frequency divider circuits connected in series from said voltage controlled oscillator for providing a plurality of harmonics of said portamento signal, said harmonics corresponding to said note being played in a plurality of voices by said electronic musical instrument.

9. A portamento system according to claim 8, further including a system control circuit connected to said frequency dividers and to said electronic musical instrument to selectively transfer said portamento signal and said harmonics thereof from said frequency dividers and said note being played in a plurality of voices from said electronic musical instrument back to said electronic musical instrument.

10. A portamento system for use with an electronic musical instrument comprising: a voltage controlled oscillator for producing a first input signal, said electronic musical instrument producing a second input signal, a frequency/phase detector circuit for producing a plurality of control signals proportional to the frequency and phase error between said first and second input signals, a ramp and hold circuit for receiving said plurality of control signals and producing a control voltage in response thereto, said control voltage being fed back to said voltage controlled oscillator for varying the frequency of said first input signal at a predetermined rate to produce a portamento signal therefrom, said ramp and hold circuit including feedback circuit means for controlling said predetermined rate so that the varying frequency first signal is usable for producing an audible portamento effect.

11. A portamento system for use with an electronic musical instrument comprising: a voltage controlled oscillator for producing a first input signal, said electronic musical instrument producing a second input signal, a frequency/phase detector circuit for producing a plurality of control signals proportional to the frequency and phase error between said first and second input signals, a ramp and hold circuit for receiving said plurality of control signals and producing a control voltage in response thereto, said control voltage being fed back to said voltage controlled oscillator for varying the frequency of said first input signal at a predetermined rate to produce a portamento signal therefrom and wherein said ramp and hold circuit causes said control voltage to ramp up at a predetermined ramp rate when said first input signal is of a lower frequency than said second input signal and when said first input signal lags behind said second input signal in phase, to hold constant when said first input signal matches said second input signal in phase and frequency, and to ramp down at said predetermined ramp rate when said first input signal is of a greater frequency than said second input signal and when said first input signal leads said second input signal in phase, said predetermined rate of variation of said first input signal corresponding to said predetermined ramp rate of said control voltage.

12. A portamento system according to claim 11 wherein said ramp and hold circuit further includes a feedback circuit for varying said predetermined ramp rate of said control voltage to correspond to the variation in the rate of frequency change between the notes of the scale of even temperament.

13. A portamento system according to claim 12 wherein said electronic musical instrument comprises a monotonic keyboard instrument, the notes of said keyboard being arranged in the scale of even temperament, and further including means for producing a pulse signal and a gate signal whenever a key on said keyboard is depressed.

14. A portamento system according to claim 13 wherein said feedback circuit further includes means accessible to the user to selectively adjust said predetermined ramp rate of said control voltage to produce a portamento signal of a desired speed.

15. A portamento system according to claim 14 further including a plurality of frequency divider circuits connected in series from said voltage control oscillator to provide a plurality of harmonics of said portamento signal.

16. A portamento system according to claim 15 wherein said electronic musical instrument further includes means for producing a plurality of signals comprising a plurality of voices of a note being played.

17. A portamento system according to claim 16 further including a system control circuit comprising switching logic connected to said frequency dividers and to said electronic musical instrument for selectively switching said portamento signal and said harmonics thereof from said frequency dividers and said plurality of voices from said electronic musical instrument back to said electronic musical instrument, steering logic connected to said electronic musical instrument and to said switching logic for receiving said gate signal and said pulse signal and producing a plurality of logic signals in response thereto and control block means for selectively switching selected ones of said logic signals from said steering logic to said switching logic, said switching logic performing said switching in accordance with said selected logic signals.

18. A portamento system according to claim 17, wherein said control block means includes first switch means accessible to the user for performing said selective switching of said logic signals according to one of three modes of operation comprising: a first mode wherein said switching logic switches said portamento signal and said harmonics thereof from said frequency dividers to said electronic musical instruments only when said keyboard is played in a legato fashion, and switches said plurality of voices from said electronics musical instrument back to said electronic musical instrument when said keyboard is played in a detached fashion, a second mode wherein said switching logic switches said portamento signal and said harmonics thereof from said frequency dividers to said electronic musical instrument only when said keyboard is played in said detached fashion and switches said plurality of voices from said electronic musical instrument back to said electronic musical instrument when said keyboard is played in said legato fashion, and a third mode wherein said switching logic switches said portamento signal and said harmonics thereof from said frequency dividers to said electronic musical instrument when said keyboard is played both in said legato fashion and in said detached fashion and does not switch said plurality of voices from said electronic musical instrument back to said electronic musical instrument.

19. A portamento system according to claim 18, wherein said control block means further includes second switch means accessible to the user for performing said selective switching of said logic signals to correspond to a portamento off mode wherein said switching logic switches only said plurality of voices from said electronic musical instrument back to said electronic musical instrument regardless of whether said keyboard is played in said legato or in said detached style.

* * * * *